(12) United States Patent
Sim et al.

(10) Patent No.: US 10,840,022 B2
(45) Date of Patent: Nov. 17, 2020

(54) ELECTRONIC COMPONENT (71) Applicant: SAMSUNG ELECTRO-MECHANICS CO., LTD., Suwon-si (KR)

(72) Inventors: Won Chul Sim, Suwon-si (KR); Gu Won Ji, Suwon-si (KR); Heung Kil Park, Suwon-si (KR); Young Ghyu Ahn, Suwon-si (KR); Se Hun Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 45 days.

(21) Appl. No.: 16/181,843

(22) Filed: Nov. 6, 2018

(65) Prior Publication Data

US 2019/0378656 A1 Dec. 12, 2019

(30) Foreign Application Priority Data

Jun. 8, 2018 (KR) ........................ 10-2018-0065790

(51) Int. Cl.
H01G 4/248 (2006.01)
H01G 4/30 (2006.01)
(Continued)

(52) U.S. Cl.
CPC ........... *H01G 4/248* (2013.01); *H01G 4/2325* (2013.01); *H01G 4/30* (2013.01); *H01G 4/008* (2013.01); *H01G 4/1227* (2013.01)

(58) Field of Classification Search
CPC ........ H01G 4/248; H01G 4/2325; H01G 4/30; H01G 4/008; H01G 4/1227; H01G 2/02; H01G 2/04; H01G 2/06
See application file for complete search history.

(56) References Cited

U.S. PATENT DOCUMENTS 5,838,070 A * 11/1998 Naruse .................. H05K 1/111
257/779
6,191,933 B1 * 2/2001 Ishigaki ................ H01G 4/232
361/309

(Continued)

FOREIGN PATENT DOCUMENTS

JP 2012-204572 A 10/2012
JP 5888281 B2 3/2016
KR 10-2016-0035491 A 3/2016

*Primary Examiner* — Dion Ferguson
(74) *Attorney, Agent, or Firm* — Morgan, Lewis & Bockius LLP (57) ABSTRACT An electronic component includes a capacitor body including a plurality of dielectric layers and a plurality of first and second internal electrodes alternately disposed in a width direction. The capacitor body has first to sixth surfaces, the first and second internal electrodes being exposed through the third and fourth surfaces, respectively. First and second external electrodes are disposed on the third and fourth surfaces and extend to portions of the first surface. A first connection terminal and a second connection terminal are disposed to be respectively connected to be connected to the first and second external electrodes, and each has a shape including at least one indentation in a rectangular outline within which the respective connection terminal is inscribed.

20 Claims, 8 Drawing Sheets (51) Int. Cl.
*H01G 4/232* (2006.01)
*H01G 4/008* (2006.01)
*H01G 4/12* (2006.01)

(56) References Cited

U.S. PATENT DOCUMENTS

| | | | | |
|---|---|---|---|---|
| 9,697,953 B2* | 7/2017 | Park | ................ | H01G 4/30 |
| 9,978,525 B2* | 5/2018 | Park | ................ | H01G 4/38 |
| 2004/0183147 A1* | 9/2004 | Togashi | ................ | H01G 2/065 |
| | | | | 257/414 |
| 2010/0123995 A1* | 5/2010 | Otsuka | ................ | H01G 2/06 |
| | | | | 361/308.1 |
| 2010/0188798 A1* | 7/2010 | Togashi | ................ | H01G 2/06 |
| | | | | 361/306.3 |
| 2012/0120547 A1* | 5/2012 | Ro | ................ | H01G 4/232 |
| | | | | 361/321.3 |
| 2013/0284507 A1* | 10/2013 | Hattori | ................ | H05K 1/18 |
| | | | | 174/260 |
| 2014/0016242 A1 | 1/2014 | Hattori et al. | | |
| 2014/0041914 A1 | 2/2014 | Hattori et al. | | |
| 2014/0268487 A1* | 9/2014 | Yoshida | ................ | H01G 2/065 |
| | | | | 361/301.4 |
| 2015/0014038 A1* | 1/2015 | Park | ................ | H01G 4/30 |
| | | | | 174/260 |
| 2015/0206661 A1* | 7/2015 | Fujimura | ................ | H01G 4/30 |
| | | | | 361/301.4 |
| 2016/0042869 A1* | 2/2016 | Park | ................ | H01G 2/06 |
| | | | | 174/260 |
| 2016/0086734 A1* | 3/2016 | Park | ................ | H01G 4/30 |
| | | | | 174/260 |
| 2016/0088725 A1 | 3/2016 | Park et al. | | |
| 2016/0088733 A1* | 3/2016 | Lee | ................ | H05K 3/3442 |
| | | | | 361/768 |
| 2016/0111215 A1* | 4/2016 | Park | ................ | H01C 1/14 |
| | | | | 174/260 |
| 2016/0211074 A1* | 7/2016 | Gu | ................ | H01G 2/065 |
| 2016/0260546 A1* | 9/2016 | Mori | ................ | H01G 4/232 |
| 2018/0075973 A1* | 3/2018 | Ando | ................ | H01G 4/224 |
| 2018/0323010 A1* | 11/2018 | Park | ................ | H05K 3/3442 |
| 2019/0008036 A1* | 1/2019 | Park | ................ | H01G 4/232 |

* cited by examiner

ELECTRONIC COMPONENT

CROSS-REFERENCE TO RELATED APPLICATION(S)

This application claims benefit of priority to Korean Patent Application No. 10-2018-00065790 filed on Jun. 8, 2018 in the Korean Intellectual Property Office, the disclosure of which is incorporated herein by reference in its entirety.

BACKGROUND

1. Field

The present disclosure relates to an electronic component.

2. Description of Related Art

As noise reduction of mechanical components in recent electronic devices is progressing, acoustic noise emitted from multilayer capacitors (MLCC) has been problematic.

Since a dielectric material of the multilayer capacitor may have piezoelectric properties, it may be deformed in synchronization with an applied voltage.

When a period of the applied voltage is in an audible frequency band, displacement may form oscillations and may be transmitted to a substrate through a solder. In turn, vibrations in the substrate may be experienced as sound. This is known as acoustic noise which has been problematic in electronic devices.

The problem of acoustic noise is that when an operating environment of a device is quiet, the user may recognize acoustic noise as abnormal sound and may believe that the device has suffered a failure, or when the acoustic noise is superimposed on a sound output in the device having an audio or sound circuit, the quality of audio output of the device is deteriorated.

Apart from the acoustic noise audible to the human ear, when piezoelectric vibrations of the multilayer capacitor occur in a high frequency range of 20 kHz or more, various types of sensors used in IT and industrial/electric fields may malfunction.

SUMMARY

An aspect of the present disclosure is to provide an electronic component capable of reducing acoustic noise in an audible frequency area of 20 kHz or less and high frequency vibrations of 20 kHz or more.

According to one aspect of the present disclosure, an electronic component includes a capacitor body including a plurality of dielectric layers and a plurality of first and second internal electrodes alternately disposed in a width direction with the dielectric layer interposed therebetween. The capacitor body has a first surface and a second surface opposing each other, a third surface and a fourth surface connected to the first and second surfaces and opposing each other, a fifth surface and a sixth surface connected to the first and second surfaces and connected to the third and fourth surfaces and opposing each other in the width direction. The first and second internal electrodes are exposed through the third and fourth surfaces, respectively. A first external electrode and a second external electrode are disposed on the third and fourth surfaces of the capacitor body, respectively, and each extend to a respective portion of the first surface. A first connection terminal and a second connection terminal are respectively disposed on the first and second external electrodes in the first surface direction of the capacitor body. Each respective connection terminal of the first and second connection terminals has a shape including at least one indentation in a rectangular outline within which the respective connection terminal is inscribed In an aspect of the present disclosure, the at least one indentation, in each respective connection terminal of the first and second connection terminals, may be provided in two corners of the rectangular outline facing towards the other of the first and second connection terminals.

In an aspect of the present disclosure, the at least one indentation, in each respective connection terminal of the first and second connection terminals, may be provided along an edge of the rectangular outline facing away from the other of the first and second connection terminals.

In an aspect of the present disclosure, each of the first and second connection terminals may include a plating layer formed on the surfaces of the first and second connection terminals.

In an aspect of the present disclosure, the first and second external electrodes may each extend to respective portions of fifth and sixth surfaces of the capacitor body, and the indentations in the first and second connection terminals may be disposed below the extensions of the first and second external electrodes on the fifth and sixth surfaces.

In an aspect of the present disclosure, the extensions of the first and second external electrodes on the fifth and sixth surfaces may each have a shape including an indentation in a rectangular outline within which the respective extension on the fifth or sixth surface is inscribed.

In an exemplary embodiment of the present disclosure, the extensions of the first and second external electrodes on the first surface may each have a shape including at least one indentation in a rectangular outline within which the respective extension on the first surface is inscribed.

In an aspect of the present disclosure, the at least one indentation, in the rectangular outline within which the respective extension of each of the first and second external electrodes on the first surface is inscribed, may be disposed directly below a respective one of the third and fourth surfaces of the capacitor body.

In an aspect of the present disclosure, the first and second external electrodes may each have, on the third and fourth surfaces of the capacitor body respectively, a shape including an indentation, in a rectangular outline within which the respective first or second external electrode on the third or fourth surface is inscribed, that is adjacent to the at least one indentation in the rectangular outline within which the respective extension of each of the first and second external electrodes on the first surface is inscribed.

In an aspect of the present disclosure, a first solder receiving portion and a second solder receiving portion may respectively be provided on a mounting surface of the capacitor body and a side surface adjacent to the mounting surface by the indentations of the first and second external electrodes.

In an aspect of the present disclosure, a plating layer may be disposed on the surfaces of the first and second external electrodes.

According to another aspect of the present disclosure, an electronic component includes a capacitor body including a plurality of dielectric layers and a plurality of first and second internal electrodes alternately disposed in a width direction with the dielectric layer interposed therebetween. The capacitor body has a first surface and a second surface opposing each other, a third surface and a fourth surface connected to the first and second surfaces and opposing each other, a fifth surface and a sixth surface connected to the first and second surfaces and connected to the third and fourth surfaces and opposing each other in the width direction. The first and second internal electrodes have a first lead out portion and a second lead out portion exposed toward the first surface. A first external electrode and a second external electrode are disposed on the first surface of the capacitor body to be spaced apart from each other, and are connected to the first and second lead out portions, respectively. A first connection terminal and a second connection terminal are disposed to be respectively connected to the first and second external electrodes in the first surface direction of the capacitor body. Each respective connection terminal of the first and second connection terminals has a shape including at least one indentation in a rectangular outline within which the respective connection terminal is inscribed.

In an aspect of the present disclosure, the at least one indentation, in each respective connection terminal of the first and second connection terminals, is provided in two corners of the rectangular outline facing towards the other of the first and second connection terminals.

In an aspect of the present disclosure, the at least one indentation, in each respective connection terminal of the first and second connection terminals, is provided along an edge of the rectangular outline facing away from the other of the first and second connection terminals.

According to another aspect of the present disclosure, an electronic component includes a body including pluralities of first and second internal electrodes alternately stacked with dielectric layers therebetween. First and second external electrodes are disposed on respective portions of a surface of the body parallel to a stacking direction of the first and second internal electrodes, and the first external electrode is electrically connected to each of the plurality of first internal electrodes and the second external electrode is electrically connected to each of the plurality of second internal electrodes. First and second connection terminals are each disposed on a respective one of the first and second external electrodes, and each of the first and second connection terminals has a shape including at least one indentation in a rectangular outline within which the respective connection terminal is inscribed.

In an aspect of the present disclosure, each of the first and second external electrode, disposed on the respective portion of the surface of the body parallel to the stacking direction of the first and second internal electrodes, may have a shape including at least one indentation in a rectangular outline within which the respective external electrode is inscribed.

In an aspect of the present disclosure, the at least one indentation in each of the first and second external electrode may overlap with the at least one indentation in a corresponding one of the first and second connection terminals.

In an aspect of the present disclosure, each of the first and second connection terminals may have a 'T' shape including two indentations.

In an aspect of the present disclosure, each of the first and second connection terminals may have a 'C' shape including only one indentation.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, exemplary embodiments of the present disclosure will be described in detail with reference to the accompanying drawings.

The present disclosure may, however, be exemplified in many different forms and should not be construed as being limited to the specific embodiments set forth herein.

Further, these embodiments are provided so that this disclosure will be thorough and complete, and will fully convey the scope of the disclosure to those skilled in the art.

In the drawings, the shapes and dimensions of elements may be exaggerated for clarity.

Further, in the drawings, elements having the same functions within the same scope of the inventive concept will be designated by the same reference numerals.

Throughout the specification, when a component is referred to as "comprise" or "comprising," it means that it may include other components as well, rather than excluding other components, unless specifically stated otherwise.

Figure 1:
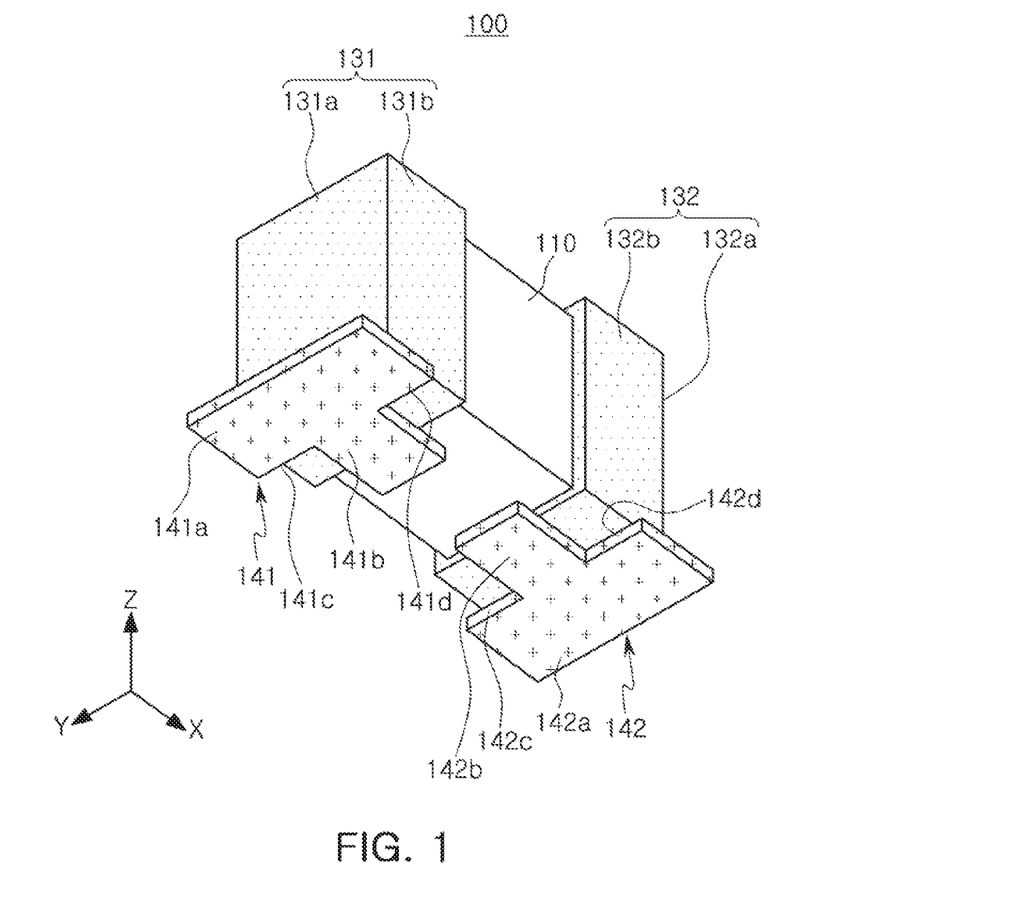
FIG. 1 is a perspective view schematically illustrating an electronic component according to a first exemplary embodiment.
Figure 2A:
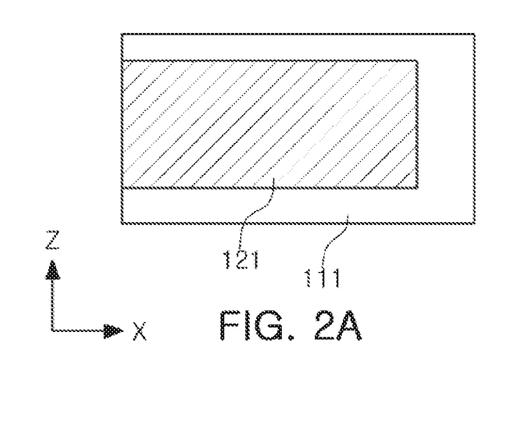
FIG. 2A and FIG. 2B are plan views respectively illustrating the first and second internal electrodes of the electronic component according to the first exemplary embodiment.
Figure 2B:
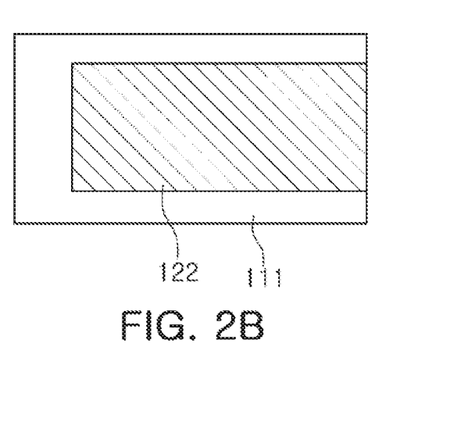

FIG. 1 is a perspective view schematically illustrating an electronic component according to a first exemplary embodiment, and FIGS. 2A and 2B are plan views respectively illustrating first and second internal electrodes of the electronic component according to a first exemplary embodiment.

Referring to FIGS. 1, 2A, and 2B, an electronic component 100 according to a first exemplary embodiment includes a capacitor body 110, a first external electrode 131 and a second external electrode 132, and a first connection terminal 141 and a second connection terminal 142.

Hereinafter, an illustrative direction of the capacitor body 110 is defined to clearly explain an exemplary embodiment of the present disclosure. The X, Y and Z directions illustrated in the figures represent a longitudinal direction, a width direction, and a thickness direction of the capacitor body 110, respectively. Further, in the present exemplary embodiment, the Y direction may be used to have the same meaning as the stacking direction in which the dielectric layers are stacked.

The capacitor body 110 is formed by stacking a plurality of dielectric layers 111 in the Y direction and then firing, and includes the plurality of dielectric layers 111 and a plurality of first and second internal electrodes 121 and 122 alternately disposed in the Y direction with the dielectric layers 111 interposed therebetween.

Further, a cover having a predetermined thickness may be formed as a margin portion at both sides of the capacitor body 110 in the Y direction.

At this time, respective dielectric layers 111 of the capacitor body 110, adjacent to each other, may be integrated such that boundaries therebetween may not be readily visible or confirmed.

The capacitor body 110 may have a generally hexahedral shape, but the present disclosure is not limited thereto.

In the present exemplary embodiment, for convenience of explanation, both surfaces opposing each other in the Z direction are referred to as first and second surfaces, both surfaces connected to the first and second surfaces and opposing each other in the X direction are referred to as third and fourth surfaces, and both surfaces connected to the first and second surfaces and connected to the third and fourth surfaces and opposing each other in the Y direction are referred to as fifth and sixth surfaces, in the capacitor body 110. In the present exemplary embodiment, the first surface may be a mounting surface.

The dielectric layers 111 may include a ceramic material having a high dielectric constant, for example, a $BaTiO_3$-based ceramic powder, but the present disclosure is not limited thereto.

Further, a ceramic additive, an organic solvent, a plasticizer, a binder, a dispersant, or the like may further be added to the dielectric layers 111, together with the ceramic powder.

The ceramic additive may be, for example, a transition metal oxide or a transition metal carbide, a rare earth element, magnesium Mg, aluminum or the like.

The first and second internal electrodes 121 and 122 are electrodes having different polarities and are alternately disposed to oppose each other in the Y direction with the dielectric layers 111 interposed therebetween. One end of the first internal electrodes 121 may be exposed through the third surface, and one end of the second internal electrodes 122 may be exposed through the fourth surfaces of the capacitor body 110.

Here, the first and second internal electrodes 121 and 122 may be electrically insulated from each other by the dielectric layer 111 disposed in the middle or therebetween.

The end portions of the first and second internal electrodes 121 and 122, alternately exposed through the third and fourth surfaces of the capacitor body 110 respectively, may be respectively connected to, and electrically connected to, the first and second external electrodes 131 and 132 disposed on the third and fourth surfaces 3 and 4 of the capacitor body 110 to be described later.

At this time, the first and second internal electrodes 121 and 122 may be formed of a conductive metal such as nickel (Ni), a nickel (Ni) alloy, or the like; however, the present disclosure is not limited thereto.

According to the above configuration, when a predetermined voltage is applied to the first and second external electrodes 131 and 132, charges are accumulated between the first and second internal electrodes 121 and 122 opposing each other.

At this time, the electrostatic capacity of the electronic component 100 is proportional to the overlapped area of the first and second internal electrodes 121 and 122 overlapping each other in the Y direction.

The first external electrode 131 is formed to be extended from the third surface of the capacitor body 110 to a portion of the first surface of the capacitor body 110.

Specifically, the first external electrode 131 may include a first connection portion 131a and a first band portion 131b.

The first connection portion 131a is formed on the third surface of the capacitor body 110 and is electrically connected to the exposed portions of the first internal electrodes 121, and the first band portion 131b is formed to be extended to a portion of the first surface of the capacitor body 110 from the first connection portion 131a.

At this time, the first band portion 131b of the first external electrode 121 may be formed to be extended to portions of the fifth and sixth surfaces of the capacitor body 110, and as required, may be formed to be further extended to a portion of the second surface of the capacitor body 110, for the purpose of improving adhesion strength, or the like.

A portion of the first band portion 131b formed on the first surface of the capacitor body 110 is a portion to which the first connection terminal 141 is connected.

The second external electrode 132 is provided with a voltage having a polarity different from that of the first external electrode 131, and is formed to be extended to a portion of the first surface of the capacitor body 110 from the fourth surface of the capacitor body 110.

Specifically, the second external electrode 132 may include a second connection portion 132a and a second band portion 132b.

The second connection portion 132a is formed on the fourth surface of the capacitor body 110 and is electrically connected to the exposed portions of the second internal electrodes 122, and the second band portion 132b is formed to be extended to a portion of the first surface of the capacitor body 110 from the second connection portion 132a.

At this time, the second band portion 132b of the second external electrode 132 may be formed to be extended to portions of the fifth and sixth surfaces of the capacitor body 110, and as required, may be formed to be further extended to a portion of the second surface of the capacitor body 110, for the purpose of improving adhesion strength, or the like.

A portion of the second band portion 132b formed on the first surface of the capacitor body 110 is a portion to which the second connection terminal 142 is connected.

Further, a plating layer may be formed on the surfaces of the first and second external electrodes 131 and 132, as desired.

For example, the first and second external electrodes 131 and 132 may include first and second conductive layers, first and second nickel (Ni) plating layers formed on the first and second conductive layers, and first and second tin (Sn) plating layers formed on the first and second plating layers, respectively. The first and second external electrodes 131 and 132 may respectively contact the first and second internal electrodes 121 and 122.

The first and second plating layers may include copper (Cu), but the present disclosure is not limited thereto.

In the present exemplary embodiment, the first and second connection terminals 141 and 142 may be disposed to correspond to the first and second band portions 131b and 132*b* formed on the first surface of the capacitor body 110 in the first and second external electrodes 131 and 132, in a direction toward the first surface of the capacitor body 110.

In other words, the electronic component 100 of the present exemplary embodiment is a structure designed to be connected to a small-sized substrate in which the multilayer capacitor 100 is positioned to be spaced apart from the substrate by the X-Y surfaces of the first and second external electrodes 131 and 132 or the first and second connection terminals 141 and 142 having various shapes such as a metal frame, or the like.

The first connection terminal 141 may have a 'T' shape and include a first terminal portion 141*a* disposed on a side facing the third surface of the capacitor body 110, relative to a center of the first connection terminal 141, and connected to the first band portion 131*b* and a first bridge portion 141*b* formed to protrude from the center of the first connection terminal 141 toward the inside the capacitor body 110 in the X direction.

The first connection terminal 141 may have first cut portions 141*c* and 141*d*. The first cut portions 141*c* and 141*d* may corresponds to indentations in a rectangular outline within which the first connection terminal 141 is inscribed and in which the first connection terminal 141 is not provided (e.g., the indentations are free of the first connection terminal 141).

In the present exemplary embodiment, a pair of the first cut portions 141*c* and 141*d* may be provided on both sides of the first bridge portion 141*b* in the Y direction on the surface of the first connection terminal 141 toward the interior of the capacitor body 110 in the X direction. For example, the indentations (e.g., 141*c*, 141*d* in the first connection terminal 141 are provided in two corners of the rectangular outline, inscribing the first connection terminal 141, facing towards the second connection terminal 142.

In detail, the first cut portions 141*c* and 141*d* may be provided at both corners of the first connection terminal 141 on the surface facing the second connection terminal 142.

In addition, the second connection terminal 142 may have a 'T' shape and include a second terminal portion 142*a* disposed on the side facing the fourth surface of the capacitor body 110, relative to a center of the second connection terminal 142, and connected to the second band portion 132*b* and a second bridge portion 142*b* formed to protrude from the center of the second connection terminal 142 toward the interior of the capacitor body 110 in the X direction to face the first bridge portion 141*b*.

And, the second connection terminal 142 may have second cut portions 142*c* and 142*d*. The second cut portions 142*c* and 142*d* may corresponds to indentations in a rectangular outline within which the second connection terminal 142 is inscribed and in which the second connection terminal 142 is not provided (e.g., the indentations are free of the second connection terminal 142).

In the present exemplary embodiment, a pair of second cut portions 142*c* and 142*d* may be provided on both sides of the second bridge portion 142*b* in the Y direction on the surface of the second connection terminal 142 toward the interior of the capacitor body 110 in the X direction. For example, the indentations (e.g., 142*c*, 142*d* in the second connection terminal 142 are provided in two corners of the rectangular outline, inscribing the second connection terminal 142, facing towards the first connection terminal 141.

In detail, the second cut portions 142*c* and 142*d* may be provided at both corners of the second connection terminal 142 on the surface facing the first connection terminal 141.

The first and second solder receiving portions may respectively be formed on the first surface, a mounting surface of the capacitor body 110, by the first and second cut portions 141*c*, 141*d*, 142*c*, and 142*d*.

When voltage potentials having different polarities are applied to the first and second external electrodes 131 and 132 formed in the electronic component 100 in a state in which the electronic component 100 is mounted on the substrate, the capacitor body 110 expands and contracts in the Z direction by an inverse piezoelectric effect of the dielectric layer 111, and both end portions of the first and second external electrodes 131 and 132 contract and expand in an inverse manner to the expansion and contraction of the capacitor body 110 in the Z direction by a Poisson effect.

Such contraction and expansion cause vibrations. In addition, the vibrations may be transmitted to the substrate from the first and second external electrodes 131 and 132, such that sound is radiated from the substrate to become acoustic noise.

On the other hand, when a voltage is applied to a vertically mounted multilayer capacitor (e.g., in which main surfaces of the internal electrodes 121 and 122 are orthogonal to amounting surface of the capacitor), both surfaces of the capacitor body 110 opposing each other in the Y direction are expanded and deformed, and both surfaces and upper and lower surfaces in the X direction are contracted and deformed.

When both surfaces of the capacitor body 110 opposing each other in the Y direction are expanded and deformed, in side portions of the first and second connection terminals 141 and 142 disposed on the mounting surface of the multilayer capacitor, pressing displacement occurs downwardly, when both surfaces of the capacitor body 110 opposing each other in the X direction and upper and lower surfaces opposing each other in the Z direction of the capacitor body 110 are contracted and deformed, in the central portion of the first and second connection terminals 141 and 142, upward displacement occurs.

In the exemplary embodiment, by providing the first and second cut portions 141*c*, 141*d*, 142*c*, and 142*d* in the side portions of the first and second connection terminals 141 and 142 in which the displacement is concentrated in the multilayer capacitor, vibrations transmitted to the substrate may be suppressed, and acoustic noise of the electronic component 100 may be reduced.

Figure 3:
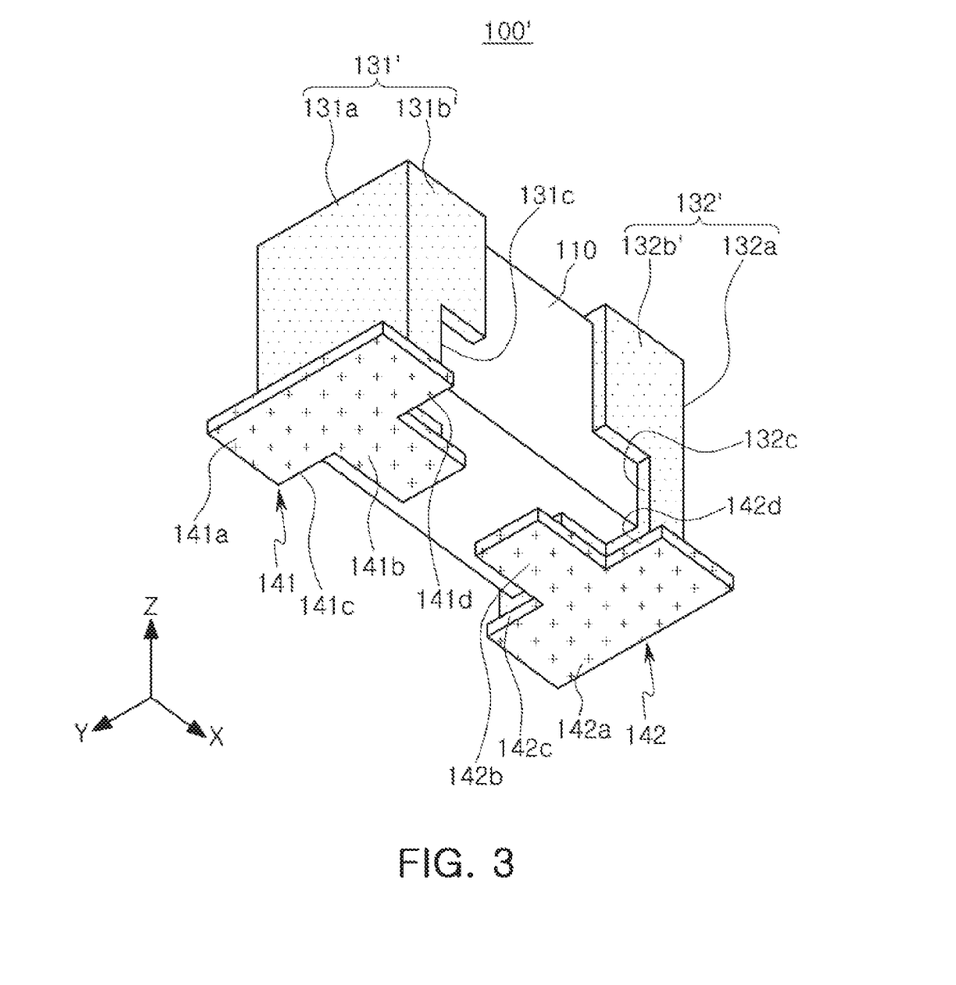
FIG. 3 is a perspective view illustrating third and fourth cut portions formed in the first and second external electrodes in FIG. 1.
Figure 4:
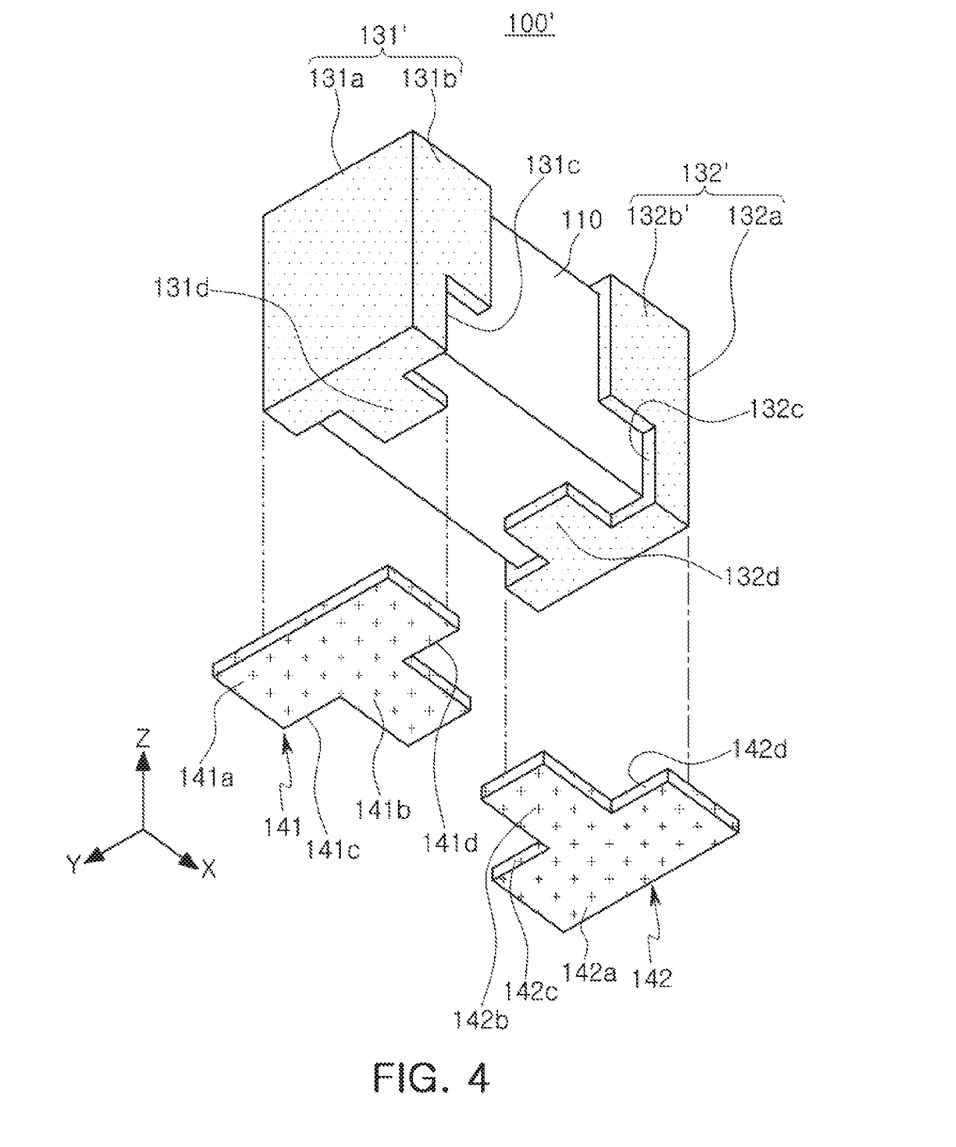
FIG. 4 is an exploded perspective view of FIG. 3.

FIG. 3 is a perspective view illustrating that the third and fourth cut portions can be formed on the first and second external electrodes in contrast the embodiment of FIG. 1, and FIG. 4 is an exploded perspective view of FIG. 3.

Referring to FIGS. 3 and 4, in a multilayer capacitor 100' according to the present exemplary embodiment, third and fourth cut portions 131*c* and 132*c* may be formed in lower portions of first and second external electrodes 131' and 132', respectively (e.g., in portions of the first and second external electrodes 131' and 132' adjacent the mounting surface).

The third cut portion 131*c* of the first external electrode 131' may be formed by partially incising portions of the first band portion 131*b*' formed in lower parts of the fifth and sixth surfaces of the capacitor body 110 and portions of the first band portion 131*b*' formed on the first surface of the capacitor body 110.

In this case, the third cut portion 131*c* may be formed by incising the first external electrode 131' such that a portion of the first band portion 131*b*' formed in a lower part of the fifth surface of the capacitor body 110 and a portion of the first band portion 131*b*' formed on the first surface of the capacitor body 110 are connected to each other, and may be formed by incising the first external electrode 131' such that a portion of the first band portion 131b' formed in a lower part of the sixth surface of the capacitor body 110 and a portion of the first band portion 131b' formed on the first surface of the capacitor body 110 are connected to each other. In one example, the third cut portion 131c may be an indentation in a rectangular outline within which the respective first band portion 131b', extended on the fifth or sixth surface, is inscribed. In a further example, the third cut portion 131c may extend to a lower surface of the capacitor body such that the first band portion 131b' of the first external electrode 131' on the first surface has a shape (on the first surface) including at least one indentation (e.g., the portion of the cut portion 131c on the first surface) in a rectangular outline within which the respective first band portion 131b' on the first surface is inscribed.

On the other hand, the third cut portion 131c may be formed by partially incising only portions of the first external electrode 131' formed in lower parts of the fifth and sixth surfaces of the capacitor body 110 of the first band portion 131b', as desired.

The fourth cut portion 132c of the second external electrode 132' may be formed by partially incising portions of the second band portion 132b' formed in a lower parts of the fifth and sixth surfaces of the capacitor body 110 and portions of the second band portion 132b' formed on the first surface of the capacitor body 110.

At this time, the fourth cut portion 132c may be formed by incising the second external electrode 132' such that a portion of the second band portion 132b' formed in a lower part of the fifth surface of the capacitor body 110 and some portions of the second band portion 132b' formed on the first surface of the capacitor body 110 are connected to each other, and may be formed by incising the second external electrode 132' such that a portion of the second band portion 132b' formed in a lower part of the sixth surface of the capacitor body 110 and some portions of the second band portion 132b' formed on the first surface of the capacitor body 110 are connected to each other. In one example, the fourth cut portion 132c may be an indentation in a rectangular outline within which the respective second band portion 132b', extended on the fifth or sixth surface, is inscribed. In a further example, the fourth cut portion 132c may extend to a lower surface of the capacitor body such that the second band portion 132b' of the second external electrode 132' on the first surface has a shape (on the first surface) including at least one indentation (e.g., the portion of the cut portion 132c on the first surface) in a rectangular outline within which the respective second band portion 132b' on the first surface is inscribed.

On the other hand, the fourth cut portion 132c may be formed by partially incising only portions of the second band portion 132b' of the second external electrode 132' formed in lower parts of the fifth and sixth surfaces of the capacitor body 110, as required.

In the present exemplary embodiment, by further providing the third and fourth cut portions 131c and 132c at a lower portion of the first and second external electrodes 131' and 132' in the multilayer capacitor, the vibrations transmitted to the substrate may be further suppressed, and the acoustic noise of the electronic component may be further reduced.

Further, the first and second solder receiving units are respectively provided at a lower portion of the first surface (i.e., the mounting surface of the capacitor body 110) and the third and fourth surfaces by the third and fourth cut portions 131c and 132c and the first and second cut portions 141b, 141d, 142b, and 142d.

Figure 5:
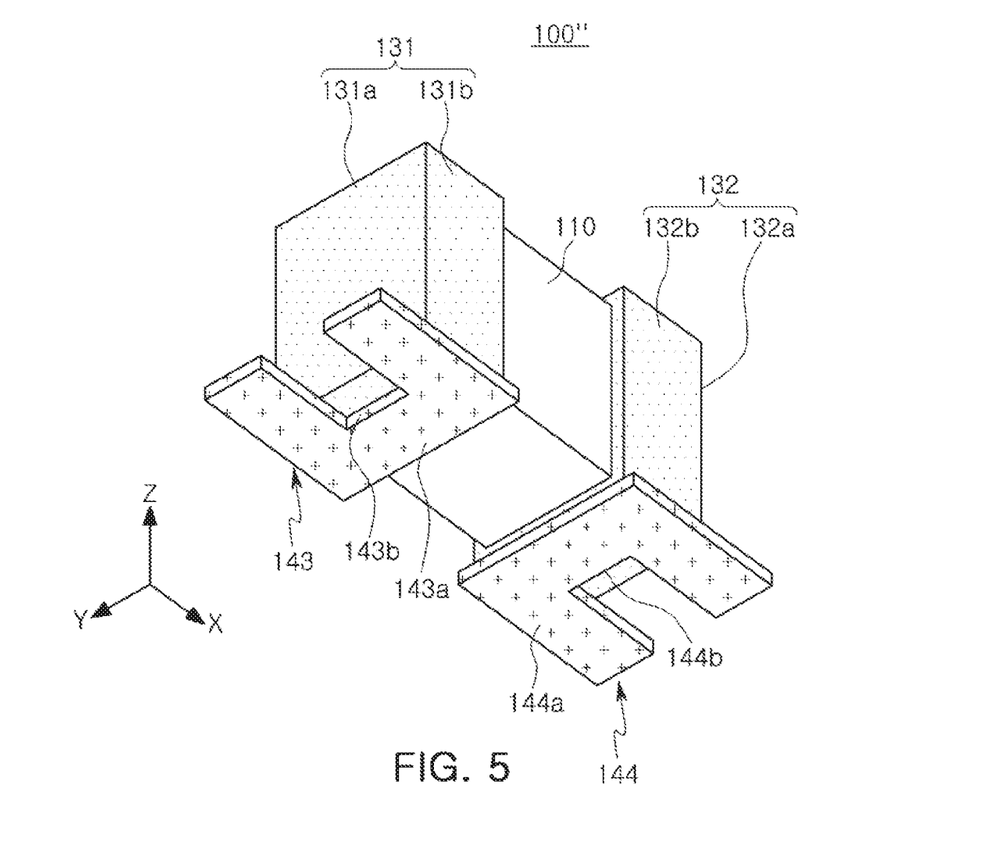
FIG. 5 is a perspective view schematically illustrating an electronic component according to a second exemplary embodiment.

FIG. 5 is a perspective view schematically illustrating an electronic component according to a second exemplary embodiment.

Referring to FIG. 5, in an electronic component 100'' according to a second exemplary embodiment, a first connection terminal having a 'C' shape may be formed of a third terminal portion 143a having a first cut portion 143b.

In detail, the first cut portion 143b may be formed by removing a portion of the surface of the first connection terminal 143 facing the outside of the capacitor body 110 in the X direction. For example, the first cut portion 143b may correspond to an indentation in a rectangular outline within which the first connection terminal 143 is inscribed and in which the first connection terminal 143 is not provided (e.g., the indentations are free of the first connection terminal 143). In one example, the indentation (e.g., 143b) in the first connection terminal 143 is provided along an edge of the rectangular outline, inscribing the first connection terminal 143, facing away from the second connection terminal 144.

In addition, a second connection terminal 144 having a 'C' shape may be formed of a fourth connection terminal 144a having a second cut portion 144b.

In detail, the second cut portion 144b may be formed by removing a portion of the surface of the second connection terminal 144 facing the outside of the capacitor body 110 in the X direction. For example, the second cut portion 144b may correspond to an indentation in a rectangular outline within which the second connection terminal 144 is inscribed and in which the second connection terminal 144 is not provided (e.g., the indentations are free of the second connection terminal 144). In one example, the indentation (e.g., 144b) in the second connection terminal 144 is provided along an edge of the rectangular outline, inscribing the second connection terminal 144, facing away from the first connection terminal 143.

When a voltage is applied to the vertically mounted multilayer capacitor, both surfaces of the capacitor body 110 are expanded and deformed in the Y direction, and both surfaces opposing each other in the X direction, as well as upper and lower surfaces, are contracted and deformed.

When both surfaces of the capacitor body 110 opposing each other in the Y direction are expanded and deformed, in the side portions of the first and second connection terminals 143 and 144 disposed on the mounting surface of the multilayer capacitor, pressing displacement occurs downwardly, and when both surfaces of the capacitor body 110 opposing each other in the X direction and the upper and lower surfaces of the capacitor body 110 opposing each other in the Z direction are contracted and deformed, in the central portion of the first and second connection terminals 143 and 144, upward displacement occurs.

In the present exemplary embodiment, by providing the first and second cut portions 143b and 144b in the central portion of the first and second connection terminals 143 and 144 in which the displacement is concentrated in the multilayer capacitor, as described above, the vibrations transmitted to the substrate may be suppressed and the acoustic noise of the electronic component 100'' may be reduced.

Figure 6:
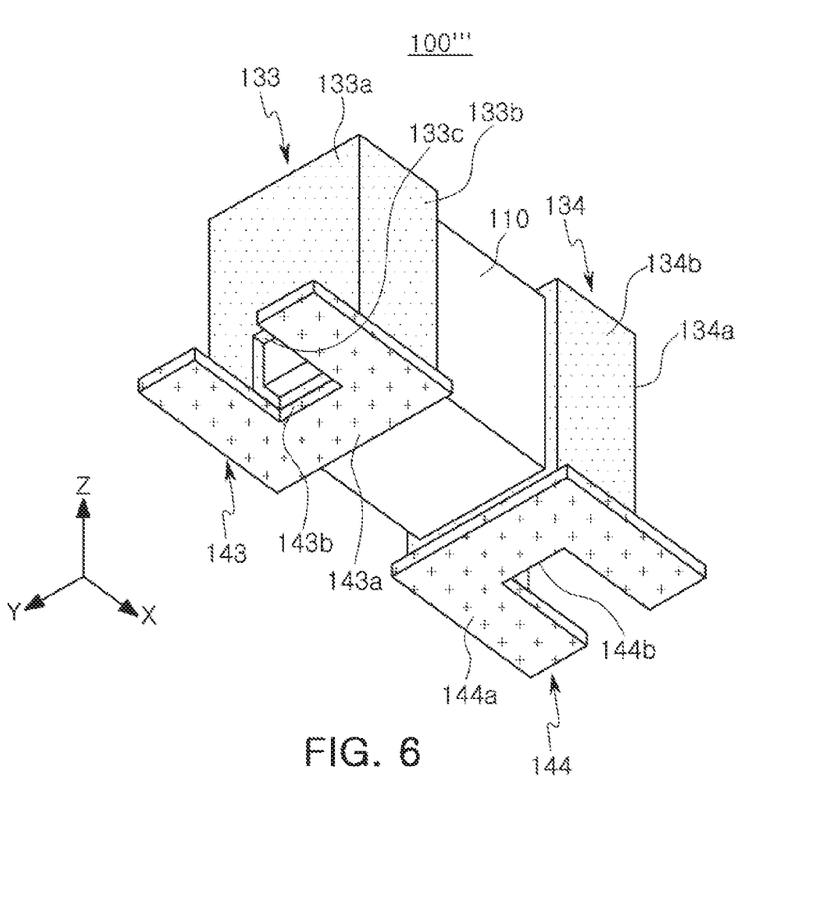
FIG. 6 is a perspective view illustrating third and fourth cut portions formed in the first and second external electrodes of the component of FIG. 5.
Figure 7:
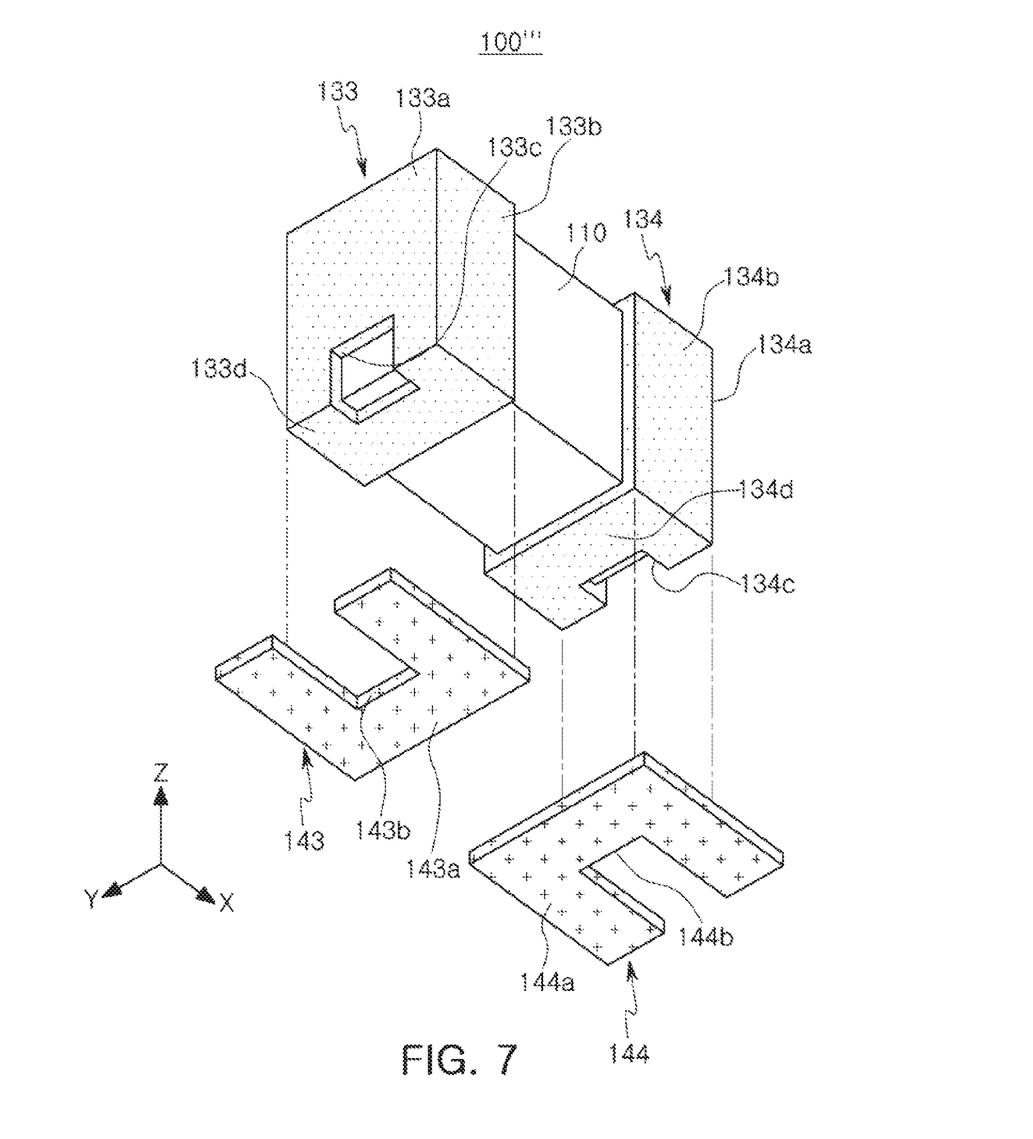
FIG. 7 is an exploded perspective view of FIG. 6.

FIG. 6 is a perspective view illustrating that third and fourth cut portions can be formed on the first and second external electrodes, and FIG. 7 is an exploded view of FIG. 6.

Referring to FIGS. 6 and 7, the multilayer capacitor 100''' of the present disclosure may have the third and fourth cut portions 133c and 134c at a lower portion of the first and second external electrodes 133 and 134, respectively.

The third cut portion 133c of the first external electrode 133 may be formed by incising a portion of a lower portion of the first connection portion 133a formed on the third surface of the capacitor body 110 and some portions of the first band portion 133b formed on the first surface of the capacitor body 110.

At this time, the third cut portion 133c may be provided by incising the first external electrode 133 such that a portion of the lower part of the first connection portion 133a and some portions 133d of the first band portion 133b formed on the first surface of the capacitor body 110 are connected to each other.

On the other hand, the third cut portion 133c may be formed by only incising a portion of the first external electrode 133 formed in a lower part of the first connection portion 131a, as desired.

In addition, the third cut portion 133c may be disposed in a position in communication with (or in alignment with, and/or adjacent to) the first cut portion 143b of the first connection terminal 143.

In addition, the fourth cut portion 134c of the second external electrode 134 may be formed by incising a portion of a lower portion of the second connection portion 134a formed on the fourth surface of the capacitor body 110 and some portions of the second band portion 134b formed on the first surface of the capacitor body 110.

At this time, the fourth cut portion 134c may be formed by incising the second external electrode 134 such that a portion of a lower part of the second connection portion 134a and some portions 134d of the second band portion 134b formed on the first surface of the capacitor body 110 are connected to each other.

On the other hand, the fourth cut portion 134c may be formed by incising only a portion formed below the second connection portion 134a of the second external electrode 134, as desired.

Further, the fourth cut portion 134c may be disposed at a position in communication with (or in alignment with, and/or adjacent to) the second cut portion 144b of the second connection terminal 144.

In the present exemplary embodiment, by further providing the third and fourth cut portions 133c and 134c at the lower portions of the first and second external electrodes 133 and 134 in the multilayer capacitor, the vibrations transmitted to the substrate may be further suppressed, and the acoustic noise of the electronic component 100 may be further reduced.

Figure 8:
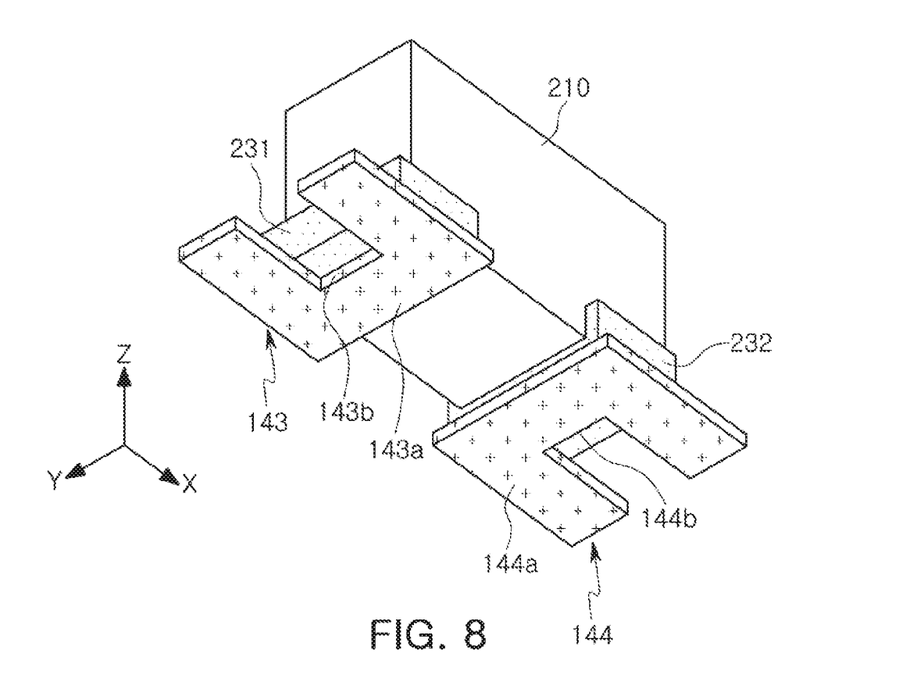
FIG. 8 is a perspective view schematically illustrating an electronic component according to another exemplary embodiment.
Figure 9A:
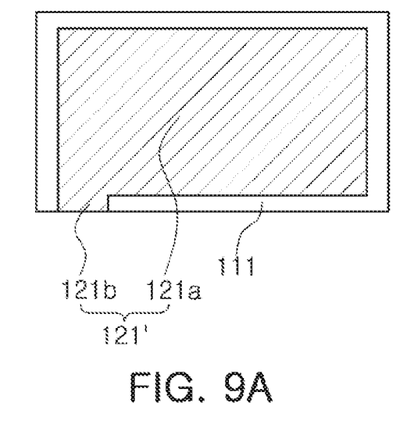
FIGS. 9A and 9B are plan views illustrating the first and second internal electrodes of the electronic component of FIG. 8, respectively.
Figure 9B:
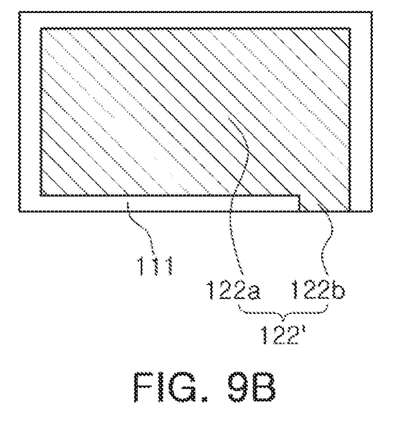

FIG. 8 is a perspective view schematically illustrating an electronic component according to another exemplary embodiment of the present disclosure, and FIGS. 9A and 9B are plan views respectively illustrating the first and second internal electrodes of the electronic component of FIG. 8.

Referring to FIGS. 8, 9A, and 9B, in the electronic component 200 of the present exemplary embodiment, the first and second external electrodes 231 and 232 are disposed on the first surface of the capacitor body 210 to be spaced apart from each other in the X direction.

The first internal electrode 121' includes a first body portion 121a and a first lead out portion 121b extending from the first body portion 121a toward the first surface of the capacitor body 210. The first lead out portion 121b may be connected (e.g., directly connected) to the first external electrode 231 and electrically connected thereto.

The second internal electrode 122' includes a second body portion 122a which overlaps the first body portion 121a in the Y direction within the electronic component 200 and a second lead out portion 122b extending from the second body portion 122a toward the first surface of the capacitor body 210. The second lead out portion 122b may be connected (e.g., directly connected) to the second external electrode 232 and may be electrically connected thereto.

The first and second connection terminals 143 and 144 are disposed to be respectively connected to the first and second external electrodes 231 and 232, and the first and second connection terminals 143 and 144 have the first and second cut portions 143b and 144b, respectively.

In the present exemplary embodiment, the first and second cut portions 143b and 144b may respectively be formed on both surfaces of the first and second connection terminals 143 and 144 opposing each other (or facing away from each other) in the X direction.

Figure 10:
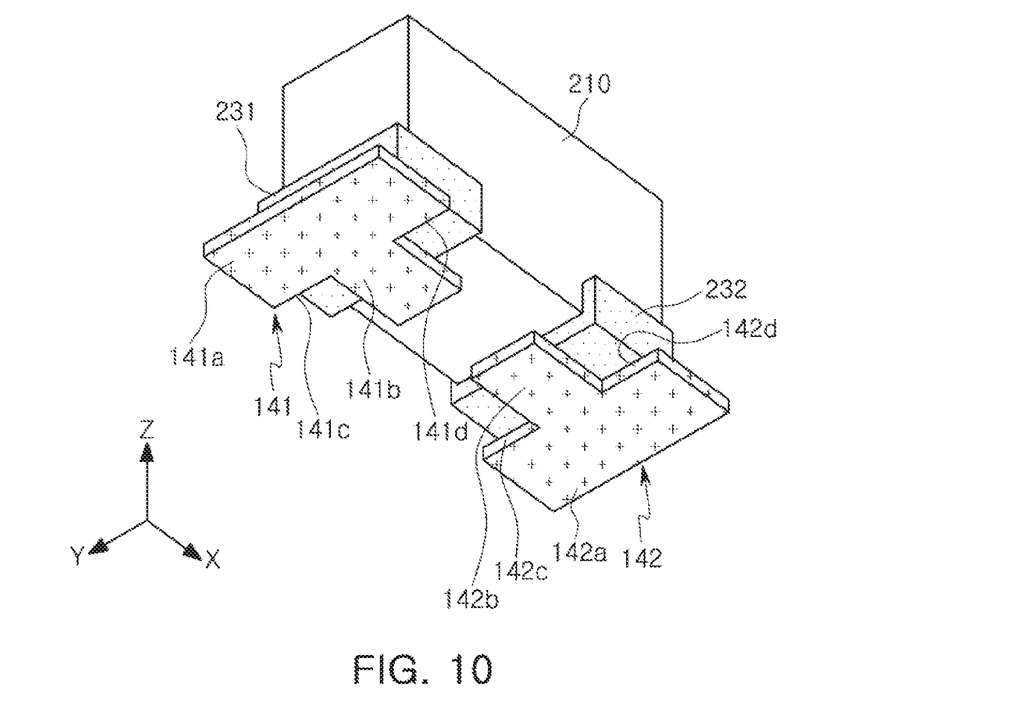
FIG. 10 is a perspective view schematically illustrating an electronic component according to another exemplary embodiment.

In addition, as another exemplary embodiment, as illustrated in FIG. 10, the first and second cut portions 141b, 141d, 142b, and 142d may be formed at both corners, of the first and second connection terminals 141 and 142, that face away from each other in the Y direction and face towards each other in the X direction.

Figure 11:
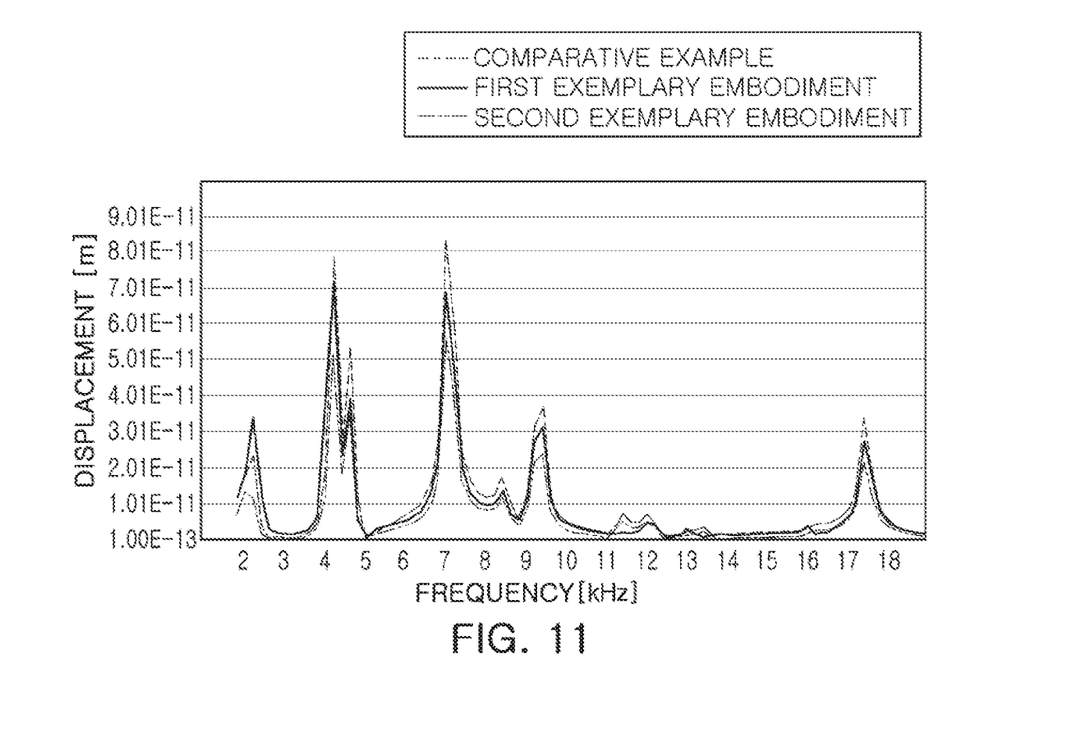
FIG. 11 shows a graph illustrating a change in displacement according to the frequency in the electronic components of a comparative example, a first exemplary embodiment, and a second exemplary embodiment.

FIG. 11 shows a plot illustrating displacement measurements in various electronic components in cases in which a connection terminal has no cut portions (see, e.g., the comparative example), and a change in the displacement characteristics when mounting on the substrate in the first exemplary embodiment including a connection terminal having a structure of cut portions as shown in FIG. 1 and a second exemplary embodiment including a connection terminal having a structure of cut portions as shown in FIG. 5.

In the multilayer capacitor having a vertically mounted structure, the vibration displacement may be concentrated in two places.

Specifically, when the connection terminal is disposed on the mounting surface of the capacitor body, upward displacement by shrinkage deformation in the X direction and the Z direction at the central portion of the connection terminal may occur, while displacement which presses downwardly on the side portion of the connection terminal by reverse piezoelectric expansion may occur in the Y direction.

Referring to FIG. 11, as compared with the comparative example in the case of the first exemplary embodiment and the second exemplary embodiment, since the vibration displacement in one of the two areas in which the vibration displacement described above is concentrated is prevented from being transmitted to the substrate by the cut portion of the connection terminal, it could be confirmed that the acoustic noise of the electronic component is reduced.

In particular, according to FIG. 11, in the case of the second exemplary embodiment in which the cut portion is formed in the central portion of the connection terminal, it could be confirmed that the effect of reducing acoustic noise is better than that of the first exemplary embodiment in which the cut portion is formed in the side portion of the connection terminal.

As described above, since the electronic component according to the present exemplary embodiment has a structure in which an amount of vibrations transmitted to the substrate by the piezoelectric vibrations is reduced, the occurrence of acoustic noise in an audible frequency within 20 kHz of the electronic component may be effectively suppressed.

Thus, the malfunctioning of the sensors which may be a problem due to the high frequency vibration of 20 kHz or more of the electronic components in the IT or industrial/ electrical field by reducing the high frequency vibration of the stacked electronic components may be prevented and the accumulation of internal fatigue by long-time vibrations of the sensors may be suppressed.

As set forth above, according to the exemplary embodiment, acoustic noise in the audible frequency region of 20 kHz or less and a high-frequency vibration of 20 kHz or more of a stacked electronic component may be reduced.

While exemplary embodiments have been shown and described above, it will be apparent to those skilled in the art that modifications and variations could be made without departing from the scope of the present invention as defined by the appended claims.

What is claimed is:

1. An electronic component comprising:
a capacitor body including a plurality of dielectric layers and a plurality of first and second internal electrodes alternately disposed in a width direction with the dielectric layer interposed therebetween, and having a first surface that is a mounting surface and a second surface opposing the first surface, a third surface and a fourth surface connected to the first and second surfaces and opposing each other, a fifth surface and a sixth surface connected to the first and second surfaces and connected to the third and fourth surfaces and opposing each other in the width direction, the first and second internal electrodes being exposed through the third and fourth surfaces, respectively;
a first external electrode and a second external electrode disposed on the third and fourth surfaces of the capacitor body, respectively, and each extending to a respective portion of the first surface; and
a first connection terminal and a second connection terminal respectively disposed on the first and second external electrodes in the first surface direction of the capacitor body,
wherein each respective connection terminal of the first and second connection terminals has a shape on the first surface including at least one indentation, in a rectangular outline within which the respective connection terminal on the first surface is inscribed, that abuts two adjacent sides of the rectangular outline on the first surface.

2. The electronic component according to claim 1, wherein the at least one indentation, in each respective connection terminal of the first and second connection terminals, is provided in two corners, of the rectangular outline on the first surface, facing towards the other of the first and second connection terminals.

3. The electronic component according to claim 1, wherein each respective connection terminal of the first and second connection terminals has a 'T' shape on the first surface.

4. The electronic component according to claim 1, wherein each of the first and second connection terminals includes a plating layer disposed on surfaces of the first and second connection terminals.

5. The electronic component according to claim 1, wherein the first and second external electrodes each extend to respective portions of the fifth and sixth surfaces of the capacitor body, and the indentations in the first and second connection terminals are disposed below the extensions of the first and second external electrodes on the fifth and sixth surfaces.

6. The electronic component according to claim 5, wherein the extensions of the first and second external electrodes on the fifth and sixth surfaces each has a shape including an indentation in a rectangular outline within which the respective extension on the fifth or sixth surface is inscribed.

7. The electronic component according to claim 1, wherein the extensions of the first and second external electrodes on the first surface each has a shape including at least one indentation in a rectangular outline within which the respective extension on the first surface is inscribed.

8. The electronic component according to claim 7, wherein the at least one indentation, in the rectangular outline within which the respective extension of each of the first and second external electrodes on the first surface is inscribed, is disposed directly below a respective one of the third and fourth surfaces of the capacitor body.

9. The electronic component according to claim 7, wherein the first and second external electrodes each has, on the third and fourth surfaces of the capacitor body respectively, a shape including an indentation, in a rectangular outline within which the respective first or second external electrode on the third or fourth surface is inscribed, that is adjacent to the at least one indentation in the rectangular outline within which the respective extension of each of the first and second external electrodes on the first surface is inscribed.

10. The electronic component according to claim 9, wherein a first solder receiving portion and a second solder receiving portion are respectively provided on a mounting surface of the capacitor body and a side surface adjacent to the mounting surface by the indentations of the first and second external electrodes.

11. The electronic component according to claim 1, wherein a plating layer is disposed on the surface of the first and second external electrodes.

12. An electronic component comprising:
a capacitor body including a plurality of dielectric layers and a plurality of first and second internal electrodes alternately disposed in a width direction with the dielectric layer interposed therebetween, and having a first surface that is a mounting surface and a second surface opposing the first surface, a third surface and a fourth surface connected to the first and second surfaces and opposing each other, a fifth surface and a sixth surface connected to the first and second surfaces and connected to the third and fourth surfaces and opposing each other in the width direction, the first and second internal electrodes have first and second lead out portions being exposed toward the first surface;
a first external electrode and a second external electrode disposed on the first surface of the capacitor body to be spaced apart from each other, and connected to the first and second lead out portions, respectively; and
a first connection terminal and a second connection terminal disposed to be respectively connected to the first and second external electrodes in the first surface direction of the capacitor body,
wherein each respective connection terminal of the first and second connection terminals has a shape on the first surface including at least one indentation, in a rectangular outline within which the respective connection terminal on the first surface is inscribed, that abuts two adjacent sides of the rectangular outline on the first surface.

13. The electronic component according to claim 12, wherein the at least one indentation, in each respective connection terminal of the first and second connection terminals, is provided in two corners, of the rectangular outline on the first surface, facing towards the other of the first and second connection terminals.

14. The electronic component according to claim 12, wherein each respective connection terminal of the first and second connection terminals has a 'T' shape on the first surface.

15. An electronic component comprising:
a body including pluralities of first and second internal electrodes alternately stacked with dielectric layers therebetween;
first and second external electrodes disposed on respective portions of a mounting surface of the body parallel to a stacking direction of the first and second internal electrodes, wherein the first external electrode is electrically connected to each of the plurality of first internal electrodes and the second external electrode is electrically connected to each of the plurality of second internal electrodes; and
first and second connection terminals each disposed on a respective one of the first and second external electrodes,
wherein each of the first and second connection terminals has a shape, on one surface of the respective one of the first and second external electrodes, including at least one indentation, in a rectangular outline within which the respective connection terminal is inscribed on the one surface of the respective one of the first and second external electrodes, that abuts two adjacent sides of the rectangular outline on the one surface.

16. The electronic component of claim 15, wherein each of the first and second external electrodes, disposed on the respective portion of the surface of the body parallel to the stacking direction of the first and second internal electrodes, has a shape including at least one indentation in a rectangular outline within which the respective external electrode is inscribed.

17. The electronic component of claim 16, wherein the at least one indentation in each of the first and second external electrode overlaps with the at least one indentation in a corresponding one of the first and second connection terminals.

18. The electronic component of claim 15, wherein each of the first and second connection terminals has a shape, including two indentations, on the one surface of the respective one of the first and second external electrodes.

19. The electronic component of claim 15, wherein each of the first and second connection terminals has a width greater than a width of the body.

20. The electronic component according to claim 1, wherein each of the first and second connection terminals has a width greater than a width of the capacitor body.

* * * * *